(12) United States Patent
Sugibayashi et al.

(10) Patent No.: US 8,299,830 B2
(45) Date of Patent: Oct. 30, 2012

(54) SEMICONDUCTOR DEVICE

(75) Inventors: Tadahiko Sugibayashi, Tokyo (JP); Noboru Sakimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/528,144

(22) PCT Filed: Jan. 18, 2008

(86) PCT No.: PCT/JP2008/050611
§ 371 (c)(1),
(2), (4) Date: Aug. 21, 2009

(87) PCT Pub. No.: WO2008/102583
PCT Pub. Date: Aug. 28, 2008

(65) Prior Publication Data
US 2010/0097108 A1    Apr. 22, 2010

(30) Foreign Application Priority Data
Feb. 23, 2007  (JP) .................................. 2007-043560

(51) Int. Cl.
*H03L 7/00*  (2006.01)
(52) U.S. Cl. ......... 327/161; 327/149; 327/153; 327/158
(58) Field of Classification Search .................. 327/530, 327/538–543, 546; 323/312–317
See application file for complete search history.

(56) References Cited

U.S. PATENT DOCUMENTS

| | | | |
|---|---|---|---|
| 4,007,122 A | 2/1977 | Owens et al. | |
| 4,105,513 A | 8/1978 | Nishino et al. | |
| 4,200,841 A | 4/1980 | Nagata et al. | |
| 2002/0191367 A1 | 12/2002 | Sakai et al. | |
| 2006/0114076 A1 | 6/2006 | Masuda et al. | |
| 2006/0126413 A1* | 6/2006 | Liaw | 365/210 |
| 2007/0057716 A1* | 3/2007 | Pan et al. | 327/539 |
| 2007/0279032 A1 | 12/2007 | Chang et al. | |
| 2008/0136503 A1* | 6/2008 | Au et al. | 327/538 |

FOREIGN PATENT DOCUMENTS

| | | |
|---|---|---|
| JP | 2-105906 A | 4/1990 |
| JP | 6-028841 A | 2/1994 |
| JP | 10-075174 A | 3/1996 |
| JP | 2000512058 A | 9/2000 |
| JP | 2002026260 A | 1/2002 |
| JP | 2002222929 A | 8/2002 |
| JP | 2003032107 A | 1/2003 |

(Continued)

OTHER PUBLICATIONS

International Search Report for PCT/JP2008/050611 mailed Feb. 19, 2008.

(Continued)

*Primary Examiner* — Lincoln Donovan
*Assistant Examiner* — Brandon S Cole (57) ABSTRACT

A semiconductor device having a nonvolatile variable resistor, includes: a resistance value conversion circuit unit configured to convert a resistance value of the nonvolatile variable resistor into a potential or a current and which outputs the converted potential or current; a comparison circuit unit configured to compare the output from the resistance value conversion circuit unit and a potential or current at a node of a portion within the semiconductor device; and a resistance value changing circuit unit configured to change the resistance value of the nonvolatile variable resistor based on the comparison results from the comparison circuit unit.

6 Claims, 13 Drawing Sheets

FOREIGN PATENT DOCUMENTS

| | | | |
|---|---|---|---|
| JP | 2004146783 A | 5/2004 |
| JP | 3592269 B | 9/2004 |
| JP | 2005012220 A | 1/2005 |
| JP | 2005101535 A | 4/2005 |
| JP | 2006319028 A | 11/2006 |
| JP | 2006339667 A | 12/2006 |
| JP | 2007042838 A | 2/2007 |
| WO | 03094227 A | 11/2003 |
| WO | 2005008783 A | 1/2005 |

OTHER PUBLICATIONS

US Office Action for U.S. Appl. No. 13/300,825 dated Mar. 27, 2012.

* cited by examiner

Fig.1

-- PRIOR ART --

Fig.2

-- PRIOR ART --

Fig.3

-- PRIOR ART --

SEMICONDUCTOR DEVICE

This application is the National Phase of PCT/JP2008/050611, filed Jan. 18, 2008, which is based upon and claims the priority of Japanese Patent Application No. 2007-043560 filed on Feb. 23, 2007, the disclosures of which are incorporated herein by reference.

FIELD OF THE INVENTION

The present invention relates to a semiconductor device and, more particularly, to a system LSI.

DESCRIPTION OF THE PRIOR ART

In a general system LSI, a logic circuit unit is configured as a synchronization circuit synchronized with a reference clock within a chip.

Figure 1:
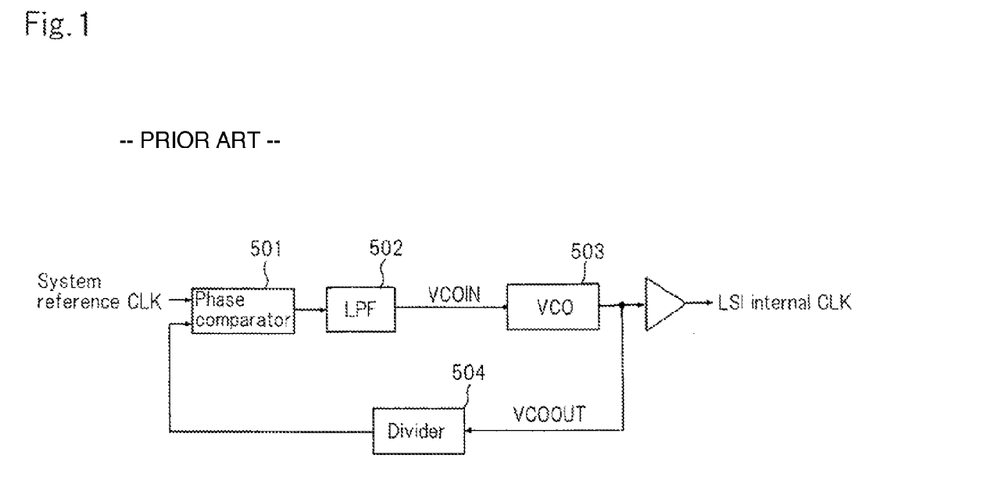
FIG. 1 shows an example of a logic circuit unit of a general system LSI.

FIG. 1 illustrates the logic circuit unit of the general system LSI.

As shown in FIG. 1, in the logic circuit unit, configured as a phase locked loop (PLL) including a phase comparator 501, a low-pass filter (LPF) 502, a voltage controlled oscillator (VCO) 503, and a divider 504, in the general system LSI, multiplication and phasing are performed based on an external system reference clock inputted to the phase comparator 501 to generate an internal reference clock. Meanwhile, if RF noise is included in an electric signal inputted to the voltage controlled oscillator (VCO) 503, an output clock is unstable, so the low-pass filter (LPF) 502 is generally interposed between the phase comparator 501 and the voltage controlled oscillator (VCO) 503.

Figure 2:
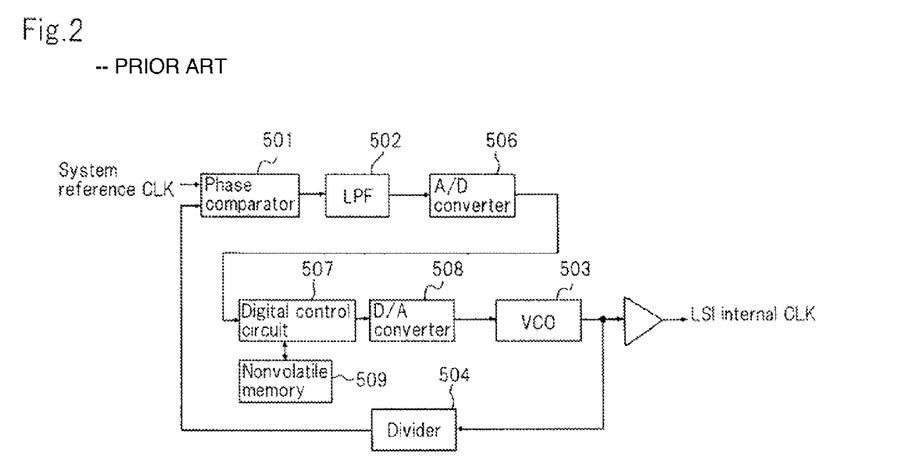
FIG. 2 shows another example of a logic circuit unit of a general system LSI.

FIG. 2 illustrates another example of the logic circuit unit of the general system LSI.

As shown in FIG. 2, the logic circuit unit includes an A/D converter 506, a digital control circuit 507, and a D/A converter 508 provided between the low-pass filter (LPF) 502 and the voltage controlled oscillator (VCO) 503, and an output of the phase comparator 501 is digitalized and stored in a nonvolatile memory 509. This configuration is disclosed in a Japanese Laid Open Publication No. 1996-75174 or a Japanese Patent Publication No. 3592269.

With such configuration, in digital processing, the initial value of a potential inputted to the voltage controlled oscillator (VCO) 503 is stored in the nonvolatile memory 509, and when power rises, the voltage controlled oscillator (VCO) 503 outputs an accurate clock frequency to shorten time taken for stabilization.

Figure 3:
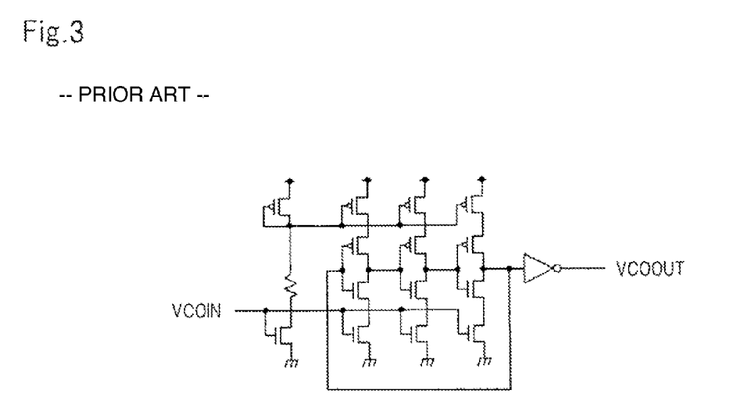
FIG. 3 shows an example of the circuit of a voltage controlled oscillator (VCO) of FIGS. 1 and 2.

FIG. 3 illustrates a circuit diagram of the voltage controlled oscillator (VCO) 503 of FIGS. 1 and 2.

As the voltage controlled oscillator (VCO) 503 of FIGS. 1 and 2, an oscillation circuit whose frequency changes according to an input voltage is used, as shown in FIG. 3.

However, as mentioned above, when the potential inputted to the voltage controlled oscillator is stored as a digital value in nonvolatile memory, the rising time of the PLL circuit may be shortened, but disadvantageously, an A/D converter for converting the phase difference according to a phase-compared analog signal into digital signal and a D/A converter for converting the digital value read from the nonvolatile memory into an analog signal are required, resulting in an increase in the size of the circuit.

SUMMARY OF THE INVENTION

The Problems to be Solved

Therefore, an object of the present invention is to provide a semiconductor device capable of making a PLL circuit rise at a high speed while reducing an area overhead.

To achieve the above object, there is provided a semiconductor device having a nonvolatile variable resistor, including: a resistance value conversion circuit unit configured to convert a resistance value of the nonvolatile variable resistor into a potential or a current and which outputs the converted potential or current; a comparison circuit unit configured to compare the output from the resistance value conversion circuit unit and a potential or current at some nodes within the semiconductor device; and a resistance value changing circuit unit configured to change the resistance value of the nonvolatile variable resistor based on the comparison results from the comparison circuit unit.

With such configuration, because the value of the potential or current of the node of the portion within the semiconductor device is always stored as the resistance value of the nonvolatile variable resistor, the value can be used in a state of an analog level.

To achieve the above object, there is also provided a semiconductor device having a nonvolatile variable capacitor, including: a capacitance value conversion circuit unit configured to convert a capacitance value of the nonvolatile variable capacitor into a potential or a current, and output the converted potential or current; a comparison circuit unit configured to compare the output from the capacitance value conversion circuit unit and a potential or current at some nodes within the semiconductor device; and a capacitance value changing circuit unit configured to change the capacitance value of the nonvolatile variable capacitor based on the comparison results from the comparison circuit unit.

With such a configuration, because the value of the potential or current at the node of the portion within the semiconductor device is always stored as the capacitance value of the nonvolatile variable capacitor, the value can be used in a state of an analog level.

As described above, according to the present invention, because the potential or current of the node of a circuit of the semiconductor device is stored as the resistance value or the capacitance value in the nonvolatile variable resistor or the nonvolatile variable capacitor, the corresponding value can be used as an input to the voltage controlled oscillator to make the PLL circuit that uses the voltage controlled oscillator rise quickly to thereby advance the initiation of the LSI to use the LSI.

DETAILED DESCRIPTION OF THE PREFERRED EMBODIMENTS

Exemplary embodiments of the present invention will now be described with reference to the accompanying drawings.

Figure 4:
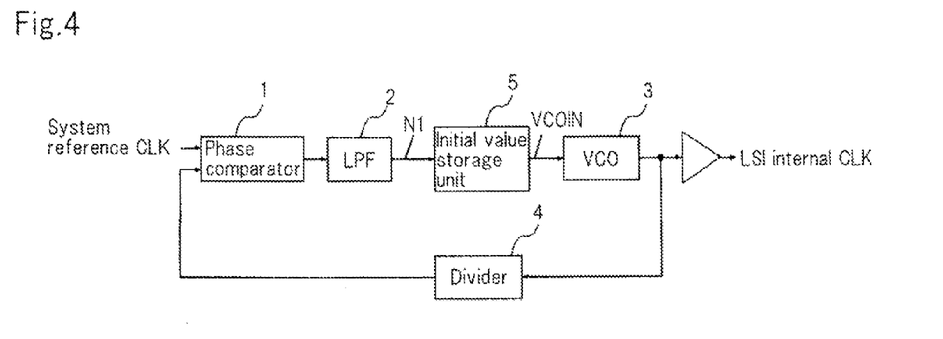
FIG. 4 shows an example of a PLL circuit using a semiconductor device according to an exemplary embodiment of the present invention.

FIG. 4 shows an example of a PLL circuit using a semiconductor device according to an exemplary embodiment of the present invention.

As shown in FIG. 4, in the PLL circuit including phase comparator 1, low pass filter (LPF) 2, voltage controlled oscillator (VCO) 3, and divider 4, initial value storage unit 5 according to an exemplary embodiment of the present invention is interposed between low-pass filter (LPF) 2 and voltage controlled oscillator (VCO) 3.

Figure 5:
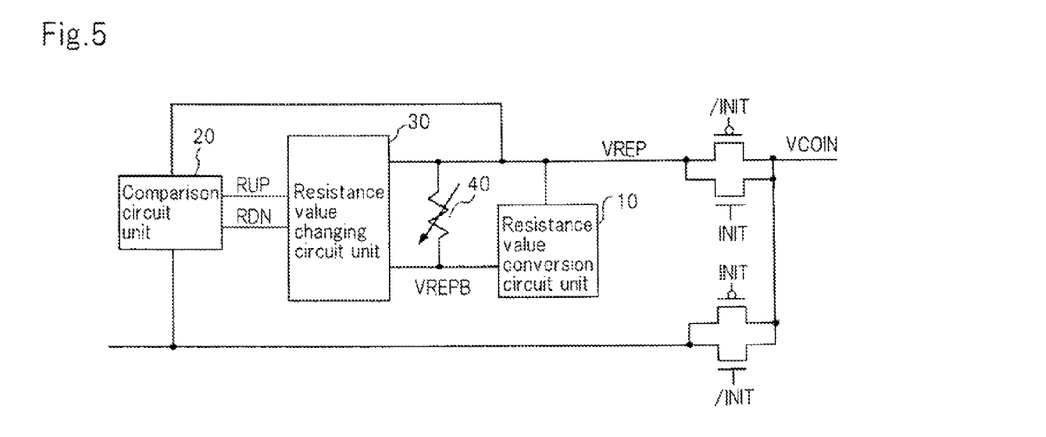
FIG. 5 shows an embodiment of an initial value storage unit of FIG. 4.

FIG. 5 shows an embodiment of the initial value storage unit 5 of FIG. 4.

In this embodiment as shown in FIG. 5, initial value storage unit 5 includes nonvolatile variable resistor 40, resistance value conversion circuit unit 10 that converts a resistance value of variable resistor 40 into a potential and outputs the converted potential, comparison circuit unit 20 that compares the output from resistance value conversion circuit unit 10 and a potential VREP at the node of a portion within initial value storage unit 5, and resistance value changing circuit unit 30 that changes the resistance value of variable resistor 40 based on the comparison results from comparison circuit 20.

Figure 6:
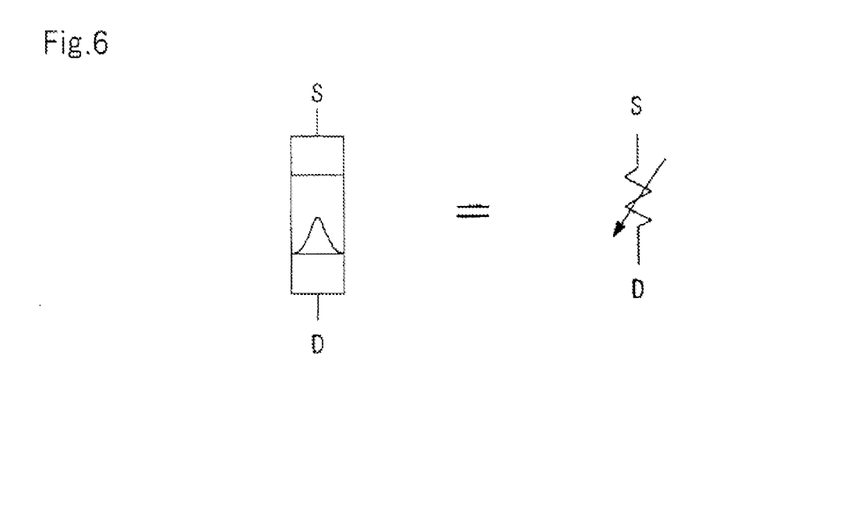
FIG. 6 shows a configuration of a variable resistor of FIG. 5.

FIG. 6 shows the configuration of variable resistor 40 of FIG. 5.

In this embodiment, as shown in FIG. 6, a solid electrolyte element is used as the variable resistor.

The solid electrolyte has a very low impedance when connected, and has a very high impedance when not connected. In addition, because the solid electrolyte can be formed between wiring layers, it may overlap with a transistor up and down, which is, thus, used as a switching element effective for reducing the chip size. A solid electrolyte incorporated into a two-terminal element is disclosed in a Japanese Laid Open Publication No. 1994-28841, Japanese Patent Publication No. 2000-512058, or a PCT No. WO2003/094227. A change in a resistance value or a capacitance value by applying a voltage between the two terminals is also disclosed in these documents. A three-terminal solid electrolyte has also been proposed, which is as disclosed in PCT No. WO2005/008783. In this document, the ON/OFF operation of a switching element is performed by a gate terminal.

Figure 7:
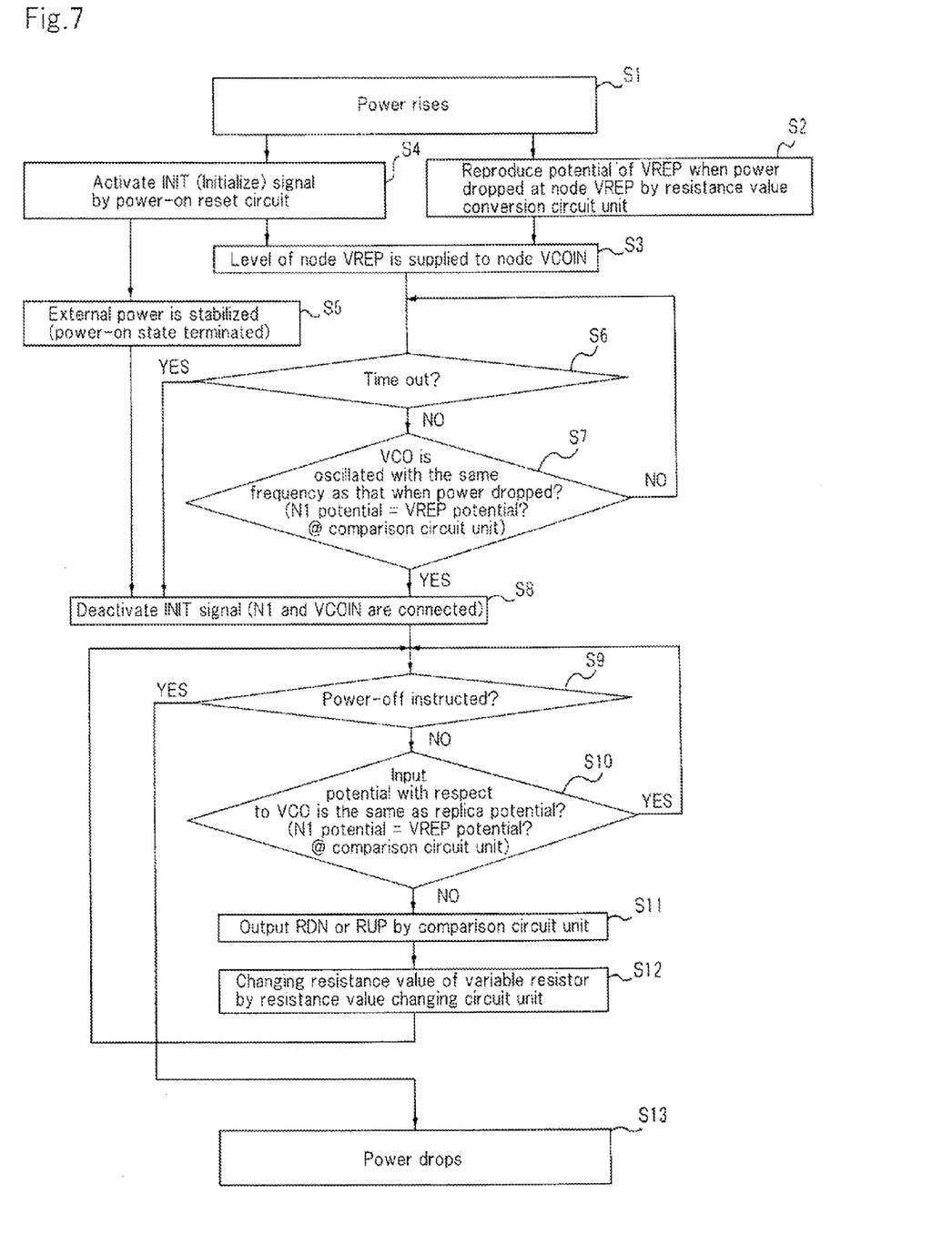
FIG. 7 is a flow chart illustrating an example of an operation of the initial value storage unit of FIG. 5.

FIG. 7 is a flow chart illustrating an example of an operation of the initial value storage unit of FIG. 5.

When power rises in step S1, a resistance value, which has been stored in variable resistor 40 when power dropped at a previous time, is converted into a potential by resistance value conversion circuit unit 10 in step S2, and a replica potential node VREP of an input potential to be inputted to voltage controlled oscillator (VCO) 3 is connected to an input signal VCOIN to be inputted to voltage controlled oscillator (VCO) 3 in step S3.

Also, at the same time, an INIT signal is activated in step S4, and external power is gradually stabilized in step S5.

Subsequently, a time-out decision (to be described) is made in step S6, and thereafter, when power rises sufficiently, voltage controlled oscillator (VCO) 3 initiates oscillation with the same frequency as that of the power when it was dropped at an early stage by the input from the VREP. Then, input N1 from low-pass filter (LPF) 2 has the same potential as that of the VREP, and accordingly, when it is detected by comparison circuit unit 20 in step S7, the INIT signal is deactivated and the input to the VCOIN is changed to N1 in step S8. Meanwhile, regarding the time-out decision as mentioned above; an input clock frequency may differ when power rises and when power drops, so in case of the time-out, the input of the VCOIN is changed to N1 at the point of the time-out.

In step S9, it is determined whether or not there is a power-off instruction. If there is no power-off instruction, namely, the level of the VREP and the potential of N1 are compared by comparison circuit unit 20 and if it is detected that the level of the VREP and the potential of the N1 are not consistent, in using the semiconductor device, in step S10, a resistance value shortage signal RUPL or a resistance value excess signal RDNL is outputted from comparison circuit unit 20 in step S11.

Then, in step S12, current flows between the VREP and a VREPB according to the signal outputted from the comparison circuit unit 20 under the control of resistance value changing circuit unit 30, and a resistance value at variable resistor 40 changes to be increased or decreased.

If there is a power-off instruction, power drops in step S13.

Figure 8:
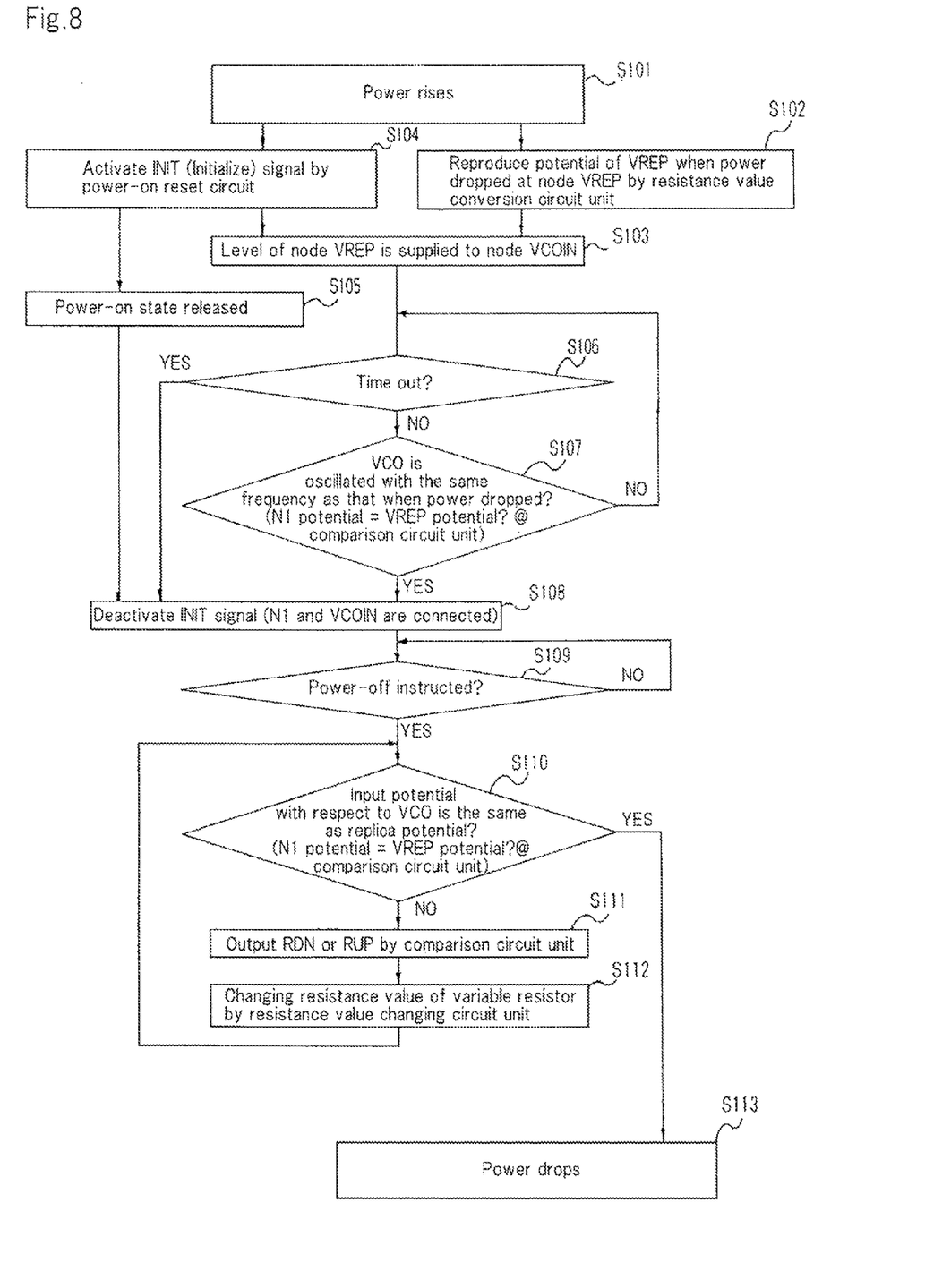
FIG. 8 is a flow chart illustrating another example of the operation of the initial value storage unit of FIG. 5.

FIG. 8 is a flow chart illustrating another example of the operation of the initial value storage unit of FIG. 5.

With the power-off instruction issued, if a system has time until when the power actually drops, it may perform processing to make the VREP and the N1 correspond during the period during when power actually drops, to thus reduce power consumption during the general operation, as shown in FIG. 8.

Figure 9:
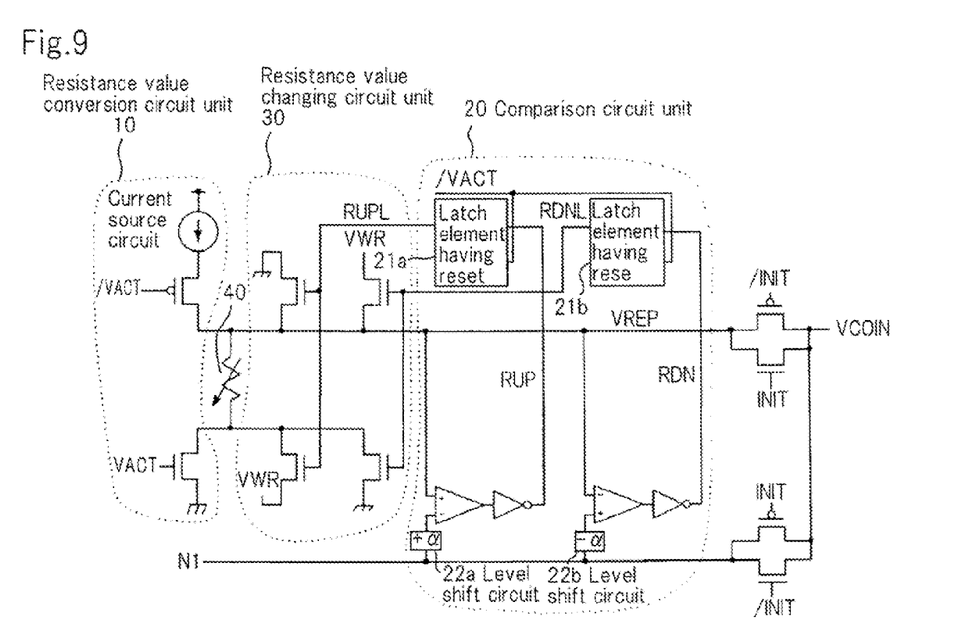
FIG. 9 is a circuit diagram showing an example of the initial value storage unit of FIG. 5.
Figure 10:
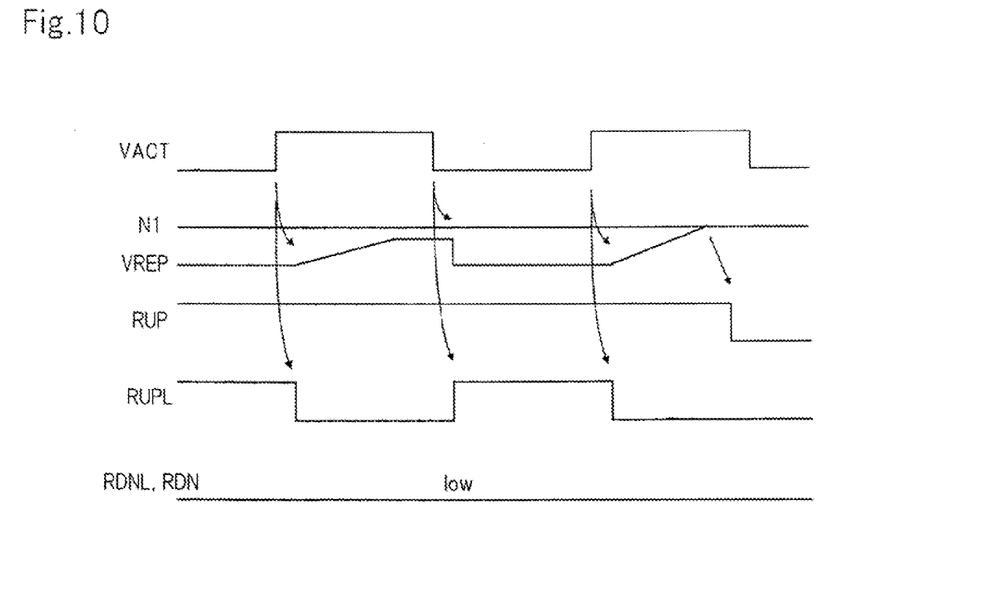
FIG. 10 is a timing chart for explaining the operation of the initial value storage unit of FIG. 9.

FIG. 9 is a circuit diagram showing an example of the initial value storage unit of FIG. 5, and FIG. 10 is a timing chart for explaining the operation of the initial value storage unit of FIG. 9.

A signal VACT inputted to the resistance value conversion circuit unit 10 is repeatedly activated as necessary. While the signal VACT is being activated, the potential at node N1 and that of its replica node VREP are compared, and if the potential at the VREP is lower, a signal RUP is activated, whereas if the potential at the VREP is higher, a signal RDN is activated. When the VACT is deactivated, these signals are latched to latch elements 21a and 21b having a reset, so as to be transferred to the signals RUPL and the RDNL. The signals RUP and RDN are reset when the VACT is activated.

The signals RUPL and RDNL activate a record transistor, and apply current such that the resistance of the solid electrolyte is increased or decreased.

Figure 11:
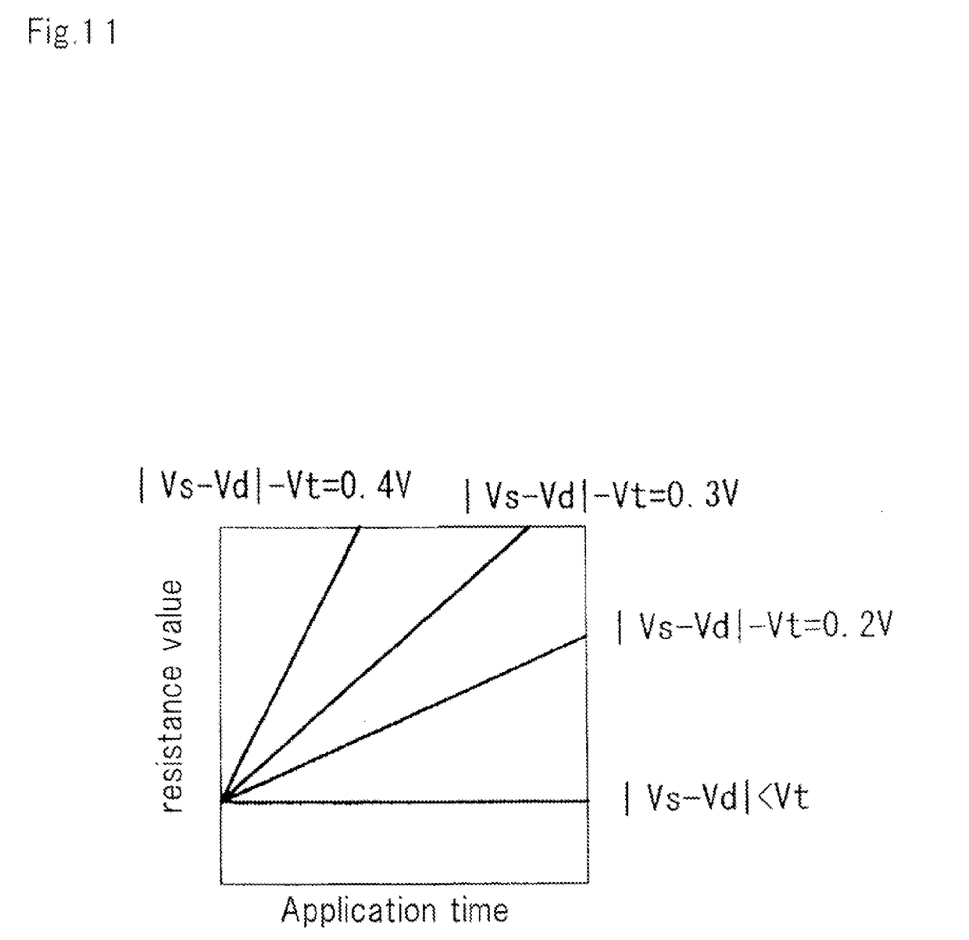
FIG. 11 illustrates the characteristics of a solid electrolyte element.

FIG. 11 illustrates the characteristics of the solid electrolyte element.

As shown in FIG. 11, the solid electrolyte element has such characteristics that its application time and resistance values change proportionally, so the potential of a record power VWR is previously set in order to prevent the resistance values from changing excessively. With this current application, variable resistor 40 is maintained with a resistance value so that substantially the same potential as that of the N1 is outputted to the VREP. Comparison circuit unit 20 has a circuit limitation precision, and because comparison circuit unit 20 cannot output perfectly the same potential, it includes level shift circuits 22a and 22b to take a margin so that the signals RUP and RDN cannot be outputted simultaneously.

Figure 12:
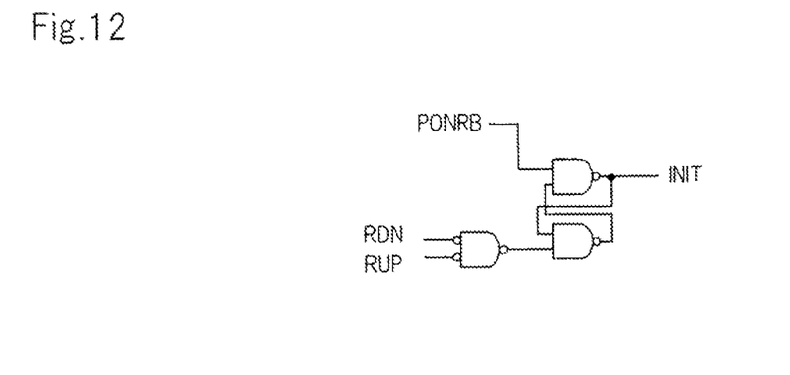
FIG. 12 illustrates a circuit for generating an INIT signal when power rises in the initial value storage unit of FIG. 9.
Figure 13:
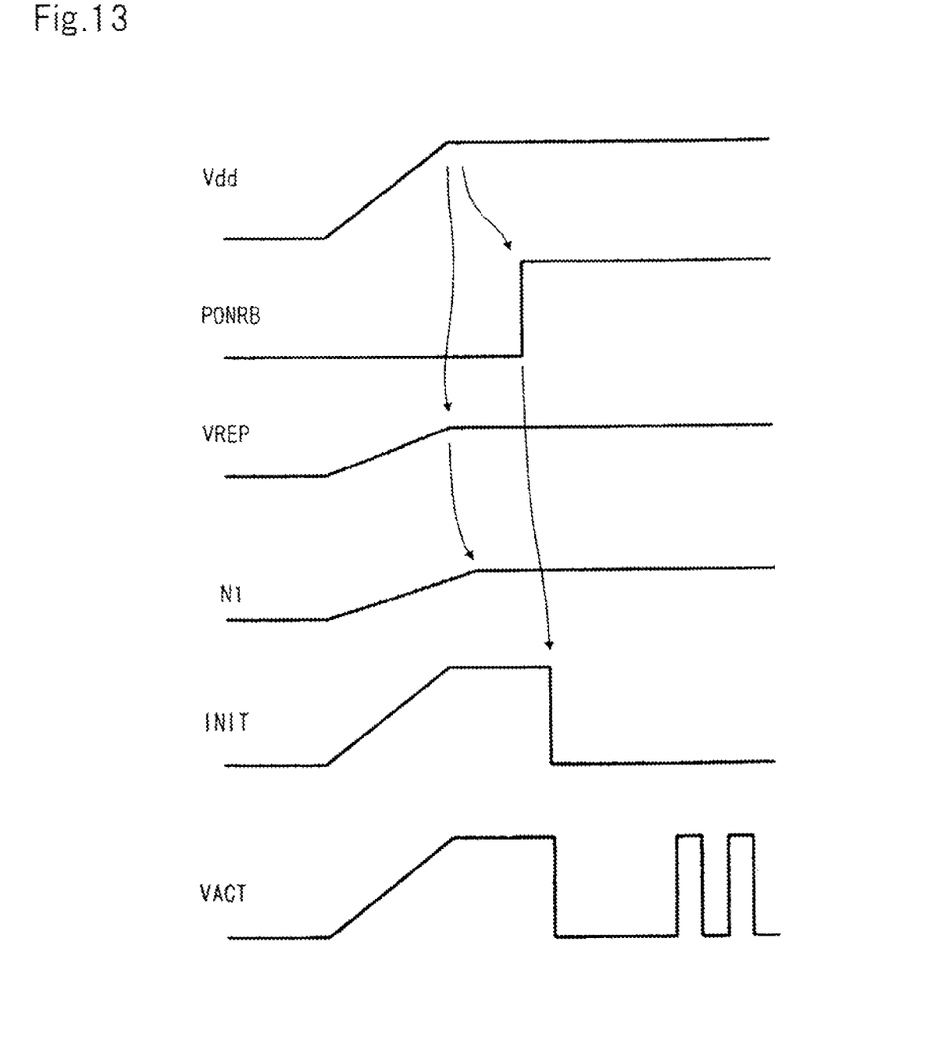
FIG. 13 illustrates operation waveforms of the circuit of FIG. 12.

FIG. 12 illustrates a circuit for generating the INIT signal when power rises in the initial value storage unit of FIG. 9, and FIG. 13 illustrates operation waveforms of the circuit of FIG. 12.

In the circuit as shown in FIG. 12, when power is turned on, a power-on reset signal PONRB has a low level and activates the INIT signal. After external power is stabilized and the power-on reset signal PONRB has a high level, if the VREP and N1 are detected to have the same potential, the INIT signal is reset. While the INIT signal is being activated, the signal VACT is always in an activated state.

Typical shortcomings of the technique that stores analog values lie in that as the device is repeatedly used, the device characteristics deteriorate leading to degradation of its precision. However, in this embodiment, although the device characteristics are degraded due to its long-time use, the degradation is not substantially changed between the time point when power drops and the immediate time point when power rises, and in addition, because the method in which the value read out to the replica node is reproduced and stored is employed, long-term degradation of the device characteristics does not affect precision of the stored potential unless there is a destructive change. Thus, the analog values can be reproduced with high precision.

Thus, the use of the resistance value of the solid electrolyte element as the initial value when power rises in the PLL does not require an absolute value of the resistance value, so, there is not much problem in compatibility with the use of the solid electrolyte element as an ON/OFF switch for switching wirings in the logical circuit, and the resistance value may have characteristics desired to be used as the ON/OFF switch.

In the general circuit, an important circuit state is potential. Thus, in this embodiment, the potential is stored as the resistance value, but obviously, the current value can also be stored by using a potential current conversion circuit for any special purpose.

Figure 14:
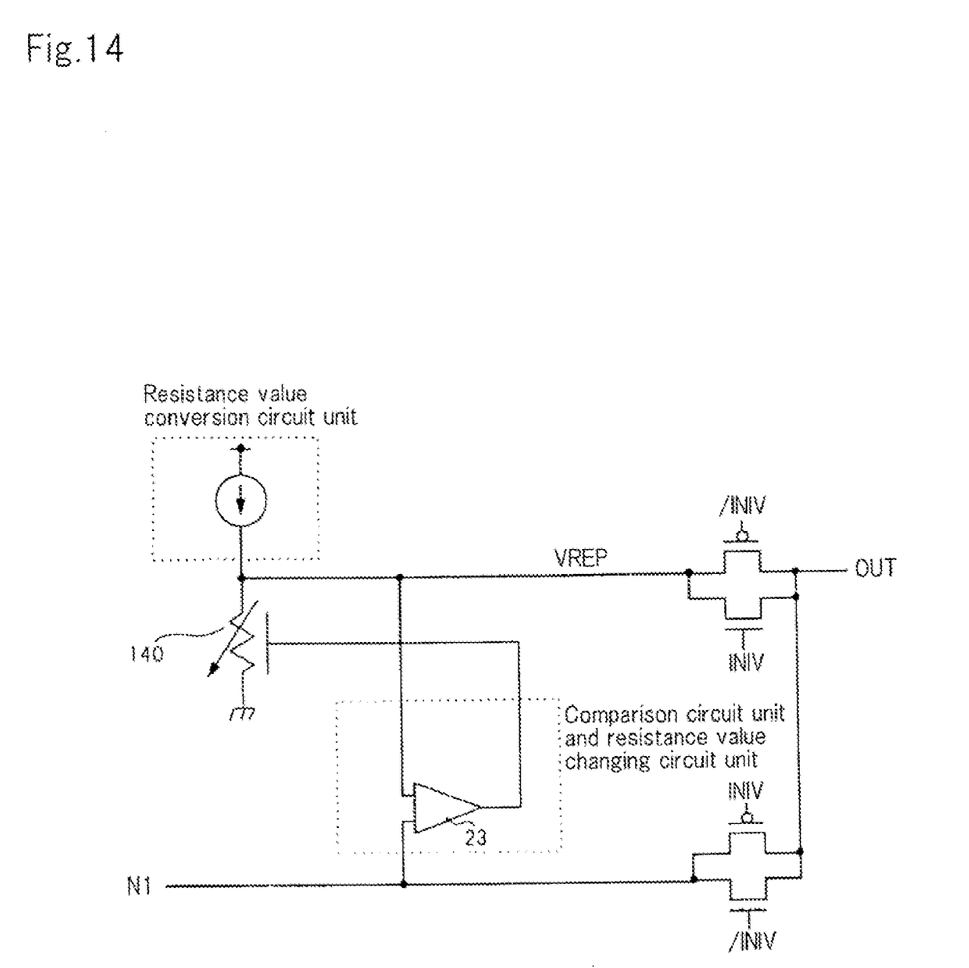
FIG. 14 is a circuit diagram showing another example of the initial value storage unit of FIG. 5.
Figure 15:
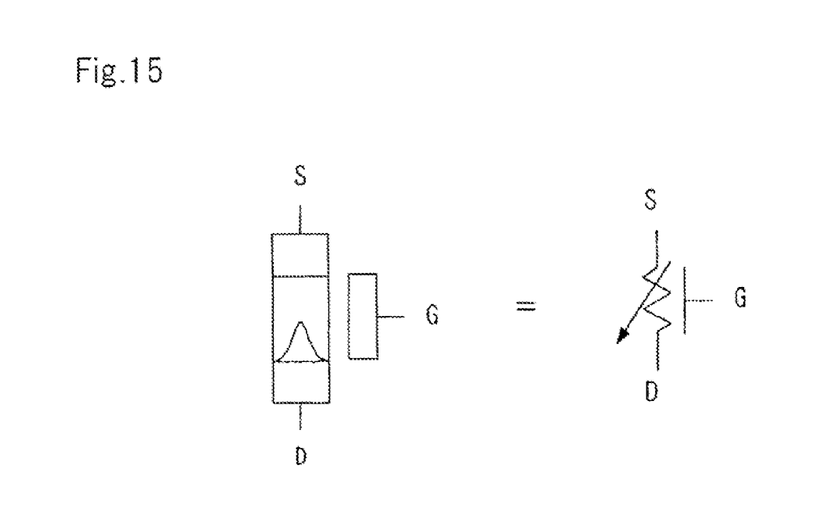
FIG. 15 illustrates an equivalent circuit of a three-terminal solid electrolyte element of FIG. 14.
Figure 16:
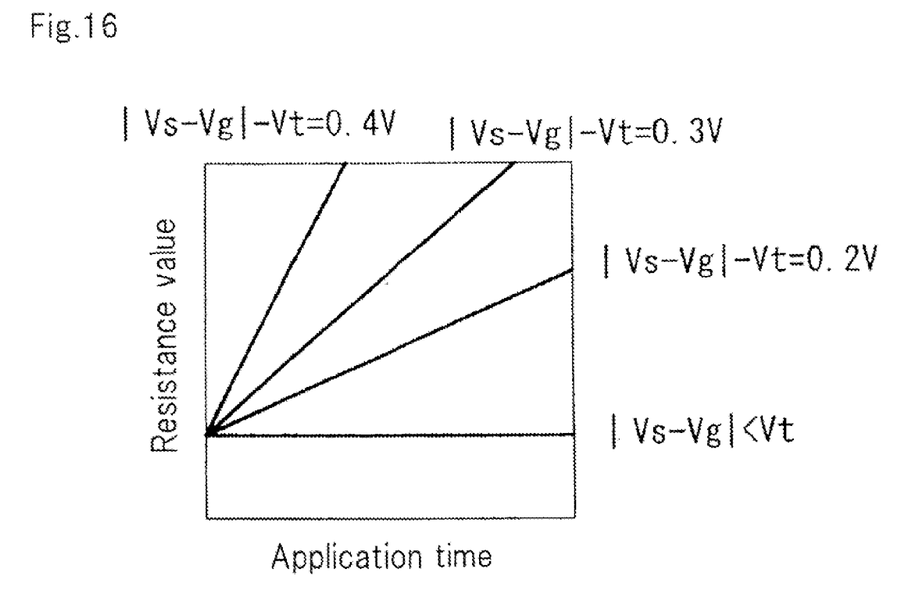
FIG. 16 illustrates the characteristics of the three-terminal solid electrolyte element of FIG. 14.

FIG. 14 is a circuit diagram showing another example of the initial value storage unit of FIG. 5, in which a three-terminal solid electrolyte element is employed. FIG. 15 illustrates an equivalent circuit of the three-terminal solid electrolyte element of FIG. 14, and FIG. 16 illustrates characteristics of the three-terminal solid electrolyte element of FIG. 14.

As shown in FIG. 14, because the three-terminal solid electrolyte element is employed, the output of a comparator 23 that compares the potential at N1 and that at the VREP can be directly used as a gate potential of solid electrolyte element 140. With such configuration, comparison circuit unit 20 and the resistance value changing circuit unit 30 can be combined to be realized as the single comparator 23.

Figure 17:
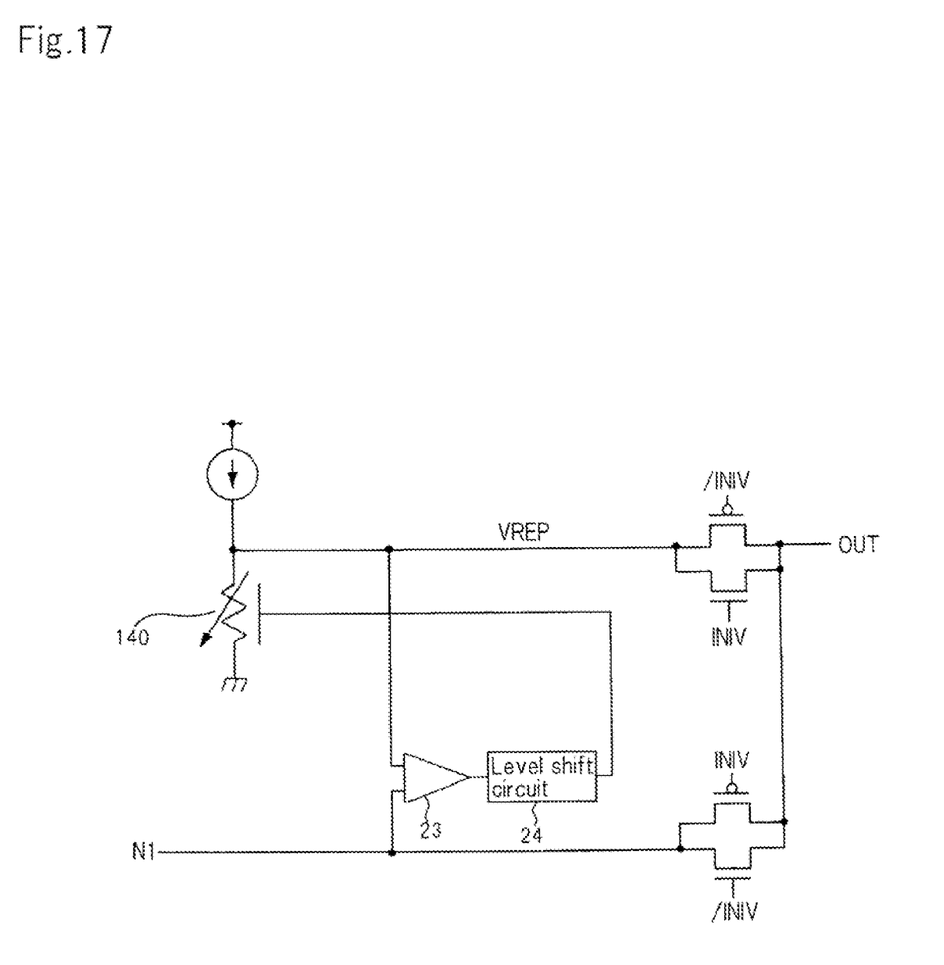
FIG. 17 is a circuit diagram showing another example of the initial value storage unit of FIG. 5.
Figure 18:
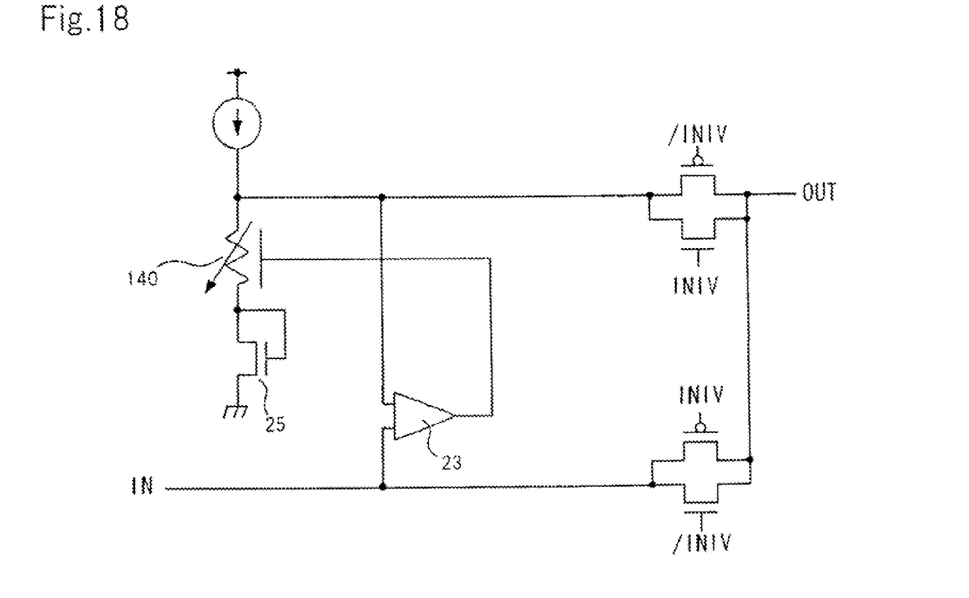
FIG. 18 is a circuit diagram showing another example of the initial value storage unit of FIG. 5.
Figure 19:
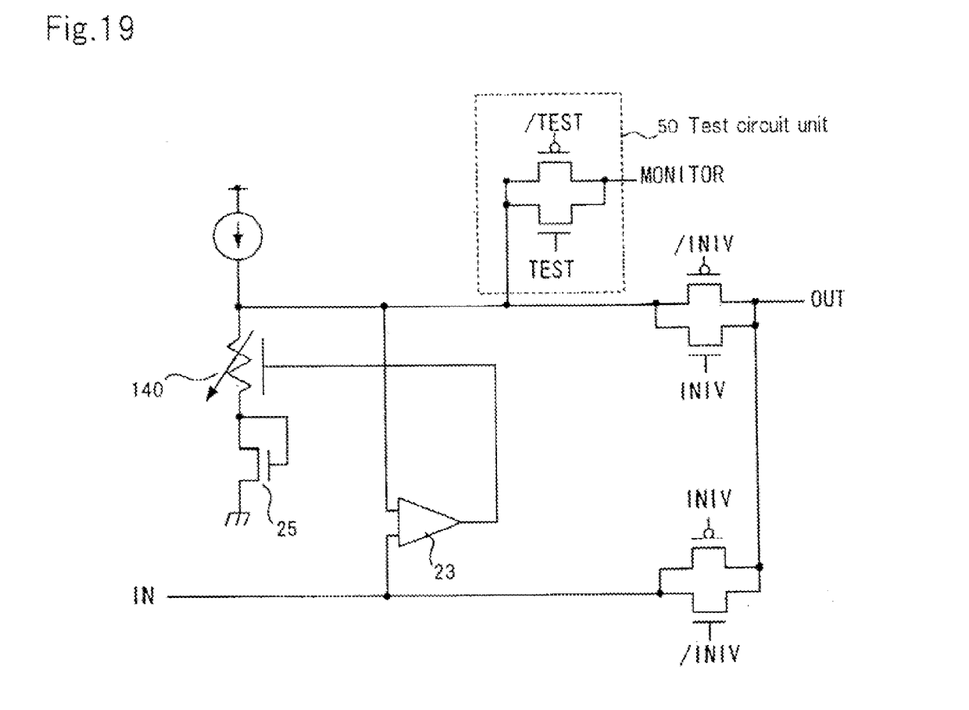
FIG. 19 is a circuit diagram showing another example of the initial value storage unit of FIG. 5.

FIGS. 17 to 19 are circuit diagrams showing another example of the initial value storage unit of FIG. 5.

In the circuit as shown in FIG. 14, an output level of the comparator 23 is limited. Thus, it is preferable to narrow the range of variation of a required resistance value by installing level shift circuit 24 before the output of comparator 23 is inputted as the gate potential of solid electrolyte element 140 as shown in FIG. 17, or by connecting a diode configured as NMOS transistor 25 to a source of three-terminal solid electrolyte element 140 as shown in FIG. 18.

Also, as shown in FIG. 19, an output from resistance value conversion circuit unit 10 is outputted to the exterior, and test circuit unit 50 is provided to check whether or not resistance value conversion circuit unit 10, comparison circuit unit 20, and resistance value changing circuit unit 30 are normally operated. It may be preferable, in terms of the reliability of the LSI, for test circuit unit 50 to execute a test mode and activate a TEST signal to inspect the potential of the VREP via a MONITOR signal. When on error occurs, it can be checked.

Figure 20:
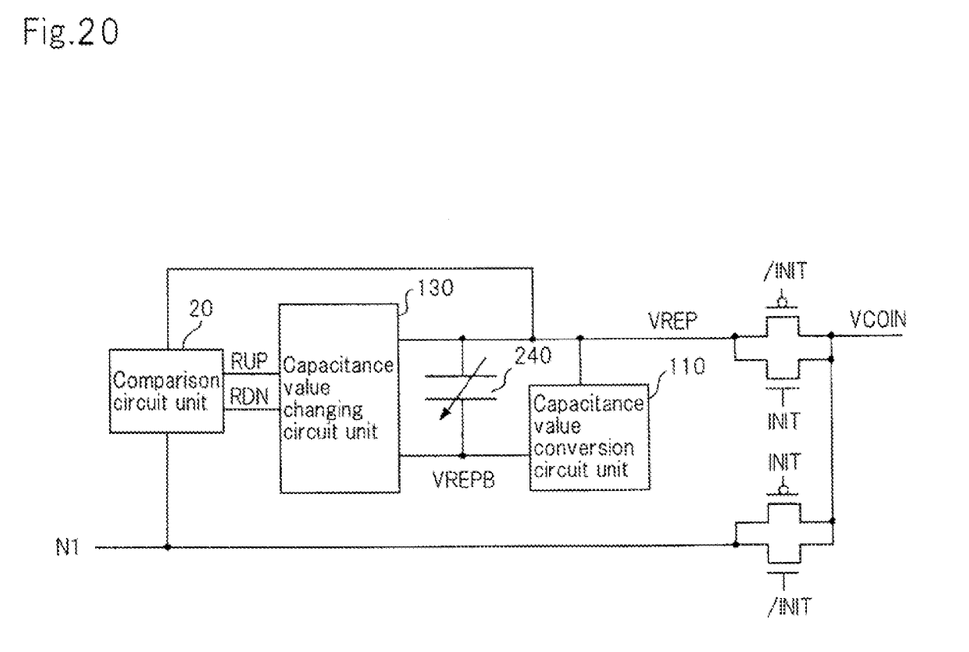
FIG. 20 shows another embodiment of the initial value storage unit of FIG. 4.

FIG. 20 shows another embodiment of the initial value storage unit of FIG. 4.

In this embodiment, as shown in FIG. 20, variable capacitor 240 is used as the solid electrolyte element of FIG. 5, capacitance value conversion circuit unit 110 is used in place of resistance value conversion circuit unit 10 of FIG. 5, and the potential when power drops is stored as a capacitance value, not as a resistance value, which is read out to output the VREP. Also, instead of resistance value changing circuit unit 30, capacitance value changing circuit unit 130 is used as a circuit for changing the capacitance value.

In initial value storage unit 5 thus configured, a normal current does not need to flow in reading out the capacitance value, reducing power consumption. In addition, in cases where a resistance value requested by the switching element is very different from requested characteristics with respect to the resistance value of a circuit that stores a potential value or a current value, making it difficult to design an element, the solid electrolyte may be used as the variable capacitor to thus completely avoid a trade-off.

As described above, when the solid electrolyte is used as the nonvolatile variable resistor or the nonvolatile variable capacitor, the solid electrolyte can be formed between wiring layers, so a chip area overhead can be reduced.

Also, a process overhead can be reduced by using the solid electrolyte as a nonvolatile switching element in the logical circuit unit and by using the solid electrolyte as a nonvolatile variable resistor in the analog circuit unit.

In addition, in the operation mode in which an output from the resistance value conversion circuit unit or the capacitance value conversion circuit unit is outputted to the exterior, whether or not a potential or a current within the chip is properly outputted can be checked even after power is cut off.

Moreover, when the solid electrolyte has the three-terminal configuration and a resistance value or capacitance value is changed according to the input of the gate terminal, the circuit size can be reduced.

Furthermore, by using the potential or current at a node stored as the resistance value of the nonvolatile variable resistor or as the capacitance value of the nonvolatile variable capacitor, as the initial value of the potential or current at another node of a circuit of a portion of the semiconductor device, the circuit state can be returned with a small-scale circuit when power rises or the like, and as a result, the returning can be performed at a high speed and power consumption can be reduced.

While the invention has been shown and described with reference to the exemplary embodiments and examples, it will be understood by those skilled in the art that the invention is not limited thereto and that various changes may be made thereto without departing from the spirit and scope of the invention as defined by the following claims.

What is claimed is:

1. A semiconductor device having a nonvolatile variable resistor, the device comprising:
a resistance value conversion circuit unit that is configured to convert a resistance value of the nonvolatile variable resistor into a potential or a current and that outputs the converted potential or current;
a comparison circuit unit configured to compare the output from the resistance value conversion circuit unit with a potential or a current at some nodes within the semiconductor device;
a resistance value changing circuit unit that is configured to change the resistance value of the nonvolatile variable resistor based on the comparison results from the comparison circuit unit,
wherein the semiconductor device is implemented as a phase-locked loop (PLL) device, and wherein the resistance value conversion circuit unit comprises:
a current source circuit;
a first transistor having a source directly connected to the current source circuit, a gate invertedly connected to a voltage input, and a drain directly connected to a first end of the nonvolatile variable resistor; and
a second transistor having a source directly connected to a second end of the nonvolatile variable resistor, a gate non-invertedly connected to the voltage input, and a drain directly connected to ground.

2. The semiconductor device according to claim 1, wherein the resistance value is stored in a solid electrolyte.

3. The semiconductor device according to claim 2, wherein the solid electrolyte is used as a nonvolatile switching element in a logical circuit unit, and used as a nonvolatile variable resistor in an analog circuit unit.

4. The semiconductor device according to claim 2, wherein the solid electrolyte has a three-terminal configuration, and its resistance value is changed according to an input of a gate terminal.

5. The semiconductor device according to claim 1, wherein an operation mode is provided to output an output from the resistance value conversion circuit unit to the exterior.

6. The semiconductor device according to claim 1, wherein a potential or a current at a node stored as a resistance value of the nonvolatile variable resistor is used as an initial value of a potential or a current at nodes of some circuits of the semiconductor device.

* * * * *